United States Patent [19]

Meaney et al.

[11] Patent Number: 5,289,113
[45] Date of Patent: Feb. 22, 1994

[54] PROM FOR INTEGRATED CIRCUIT IDENTIFICATION AND TESTING

[75] Inventors: Richard A. Meaney, Andover, Mass.; Raymond J. Speer, Donegal, Ireland

[73] Assignee: Analog Devices, Inc., Norwood, Mass.

[21] Appl. No.: 388,247

[22] Filed: Aug. 1, 1989

[51] Int. Cl.$^5$ .............................................. G01R 27/02
[52] U.S. Cl. .................... 324/73.1; 324/158 R; 371/15.1
[58] Field of Search ............... 324/158 R, 73.1, 537; 371/15.1, 16.1, 22.4, 22.1, 16.5, 25.1; 307/303, 303.1; 364/403, 550, 551.1; 29/593, 594; 437/8

[56] References Cited

U.S. PATENT DOCUMENTS

| | | | |
|---|---|---|---|
| 4,074,189 | 2/1978 | Harms et al. | 324/158 R |
| 4,150,331 | 4/1979 | Lacher | 324/537 |
| 4,183,460 | 1/1980 | Yuen et al. | 371/22.4 |
| 4,380,070 | 4/1983 | Steiner | 371/20 |
| 4,760,330 | 7/1988 | Lias, Jr. | 371/15.1 |
| 4,768,195 | 8/1988 | Stoner et al. | 324/73.1 |
| 4,942,358 | 7/1990 | Davis et al. | 324/158 R |
| 5,003,251 | 3/1991 | Fuoco | 324/158 F |

FOREIGN PATENT DOCUMENTS 0173103  3/1986  European Pat. Off. .
2214673  9/1989  United Kingdom .

*Primary Examiner*—Vinh Nguyen
*Attorney, Agent, or Firm*—Wolf, Greenfield & Sacks

[57] ABSTRACT

In an integrated circuit package, a ROM is provided for identifying the device for testing purposes. The ROM is programmed, for example, by cutting resistor links. The resistor links set the output of the PROM. This output is a binary word which is read by the tester at the same time that the tester performs measurements on the reference device. With this information the tester can then perform various calculations.

16 Claims, 4 Drawing Sheets

PROM FOR INTEGRATED CIRCUIT IDENTIFICATION AND TESTING

FIELD OF THE INVENTION

The present invention relates generally to the field of integrated circuit testing in general and, for a specific example, to the field of testing the temperature coefficients of integrated circuit voltage references.

BACKGROUND DESCRIPTION

When manufacturing integrated circuits, various needs exist for testing the devices being fabricated. Such devices often must be tested not only to determine whether they are operative, but also to determine their actual specifications. The test results are used to separate good devices from bad devices, to establish component grading, and to establish a test record for devices required to carry such a pedigree (e.g., for certain military, space and atomic energy applications).

As an example, consider a typical voltage reference product (e.g., for a digital-to-analog converter) whose temperature coefficient must be determined during the test process. One prior art method for testing electronic devices such as voltage references is to test a number of such references in sequence, in an assembly-line fashion. The references are arranged on or supplied via an apparatus which sequentially moves each of the references near an automatic tester which tests the references one at a time, performing all necessary tests on one reference before advancing to test the next reference. The measurements may be stored in the tester or in a computer, where they may be filed under the sequential number of the reference. For instance, the first reference tested is assigned the identification number 1, the second reference tested is assigned the identification number 2, and so forth, for all of the references. In calculating temperature coefficients, the output voltage of each reference is measured at a number of different temperatures, and these temperatures are also stored. The temperature coefficients for the references can then be calculated. This temperature coefficient is then compared to a specified value, to determine whether the reference has passed the test, or to a group of values, to grade the voltage reference by quality.

The problem with this method of testing is that it is very slow. The device under test (DUT) must be brought to each test temperature, in sequence, and allowed to stabilize before each measurement is made. Additionally, the test jig itself must be allowed to stabilize at each test temperature, and it may exhibit considerable thermal inertia.

Another prior art method for testing electronic devices for temperature coefficient is to arrange all of the DUTs on a large board. The board with the DUTs is then placed into an environmental chamber, where the testing takes place. The main problem with this method is that it is expensive to use and maintain an environmental chamber to perform the testing.

Yet another approach is to bring the test jig to a selected test temperature, check each DUT at that temperature, in sequence, recording the test data for each DUT as it is measured. Then, the jig temperature is changed to the next test temperature and all the DUT's are tested as before, at this new temperature. The assumption is made that the DUT's remained in the same sequence, so the second round of test data will be recorded for the correct DUT's. This sequence is repeated as many times as there are test temperatures. Once the data is all available, the temperature coefficients are calculated.

If the references do not remain in sequence when they are being tested, then the test data is meaningless. In practice it is very difficult to maintain the references in sequence. For example, device handlers may become jammed and DUT's may be damaged or otherwise may have to be removed from the sequence. This will necessitate that the tests be conducted again, from the start.

A solution to these problems is one that allows the tester to individually recognize each DUT. Each DUT is given a unique identification number and the test data can be indexed according to the DUT. There have been several methods utilized in the past for associating the identification number with the DUT, such as affixing or printing a bar code on the underside of the DUT package and mounting in the test jig an optical reader for reading the bar code. The problem with such methods is that they add considerably expense. For example, a bar code identification system requires either manual labor or additional apparatus for attaching or printing a bar code on the DUT, and equipment (i.e., an optical scanning head) to read the code.

It is therefore an object of the present invention to provide an improved and inexpensive method for identifying integrated circuit devices which are to be tested.

Another object of the invention is to provide a method for identifying integrated circuit devices which are to be tested at varying temperatures, to allow flexibility in test sequencing.

Still another object of the invention is to provide an integrated circuit structure with means facilitating identification of a DUT during the testing process.

SUMMARY OF THE INVENTION

The foregoing and other objects and advantages of the invention are achieved by providing in an integrated circuit to be tested a ROM (i.e., read-only memory) which stores a unique identification code for each device. This code identifies the reference device in which it is housed. The device identification code is written to the ROM when the device wafer is initially probed, immediately after manufacture. Therefore, when a tester tests the DUT, it reads the ROM and indexes the voltage measurement with the identification code. The measurements are therefore all correlated with each other and with the DUT.

In the exemplary embodiment discussed below, the ROM is programmable once only. That is, a laser beam programs the ROM cells by cutting selected thin film resistor links. This ROM is therefore a so-called WORM (write once read many) device, a specific specie of programmable ROM (or PROM).

The invention will be more fully understood from the detailed description below, which should be read in conjunction with the accompanying drawing.

DETAILED DESCRIPTION

The present invention utilizes, in an integrated circuit device, a memory device which can store an identification code which can be read by a tester. The identification code is used to identify the electronic device during the testing process. In a typical application, the identification code is used to identify a voltage reference circuit which supplies a reference voltage. The identification code is, in a preferred embodiment, stored in a ROM.

Figure 1A:
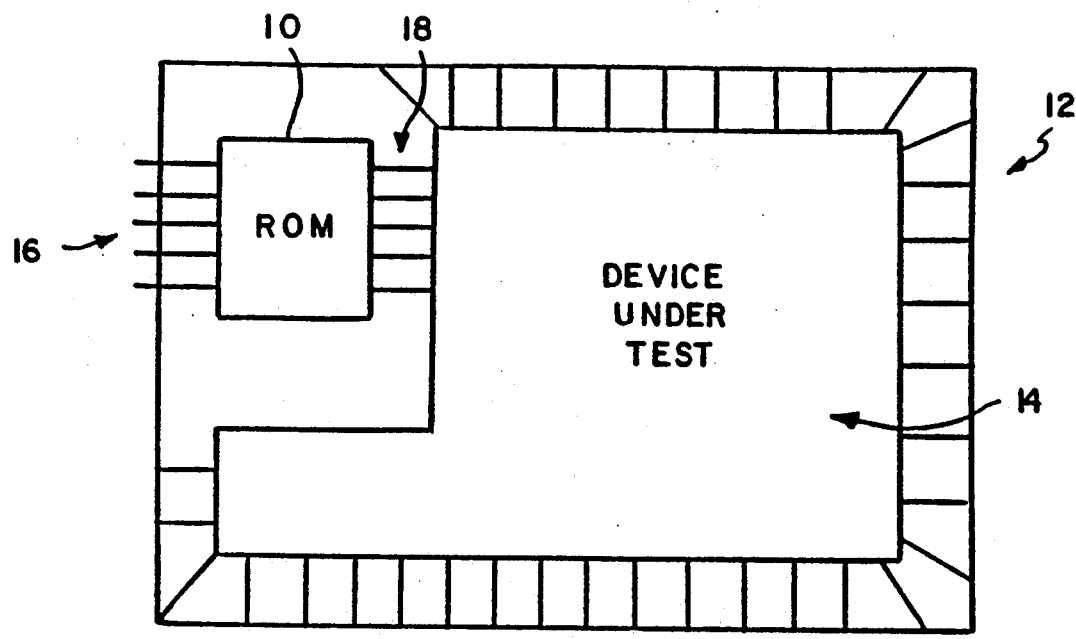
FIG. 1a is a top view of a diagrammatic illustration of an integrated circuit device package having an identification ROM, according to the present invention.
Figure 1B:
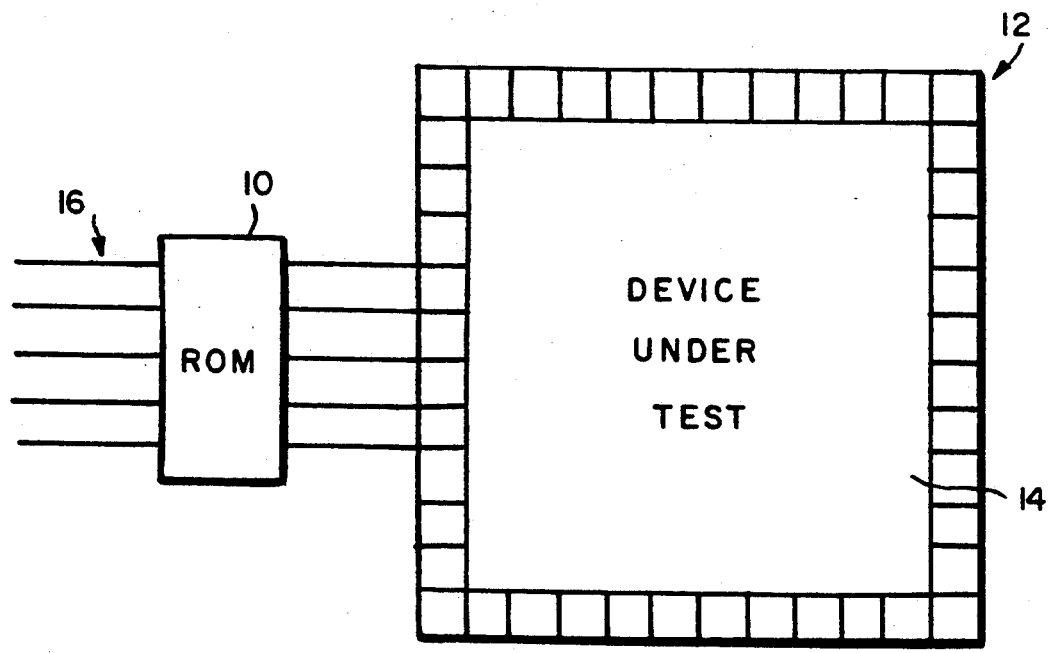
FIG. 1b is a top view of a diagramatic illustration of an integrated circuit device and an identification ROM formed on separate substrates according to the present invention.

FIG. 1a illustrates the concept of the present invention. In a preferred embodiment, the ROM 10 is housed on the same integrated circuit substrate 12 as the DUT (device under test) 14, which may, for example, be a voltage reference. However, in a multi-chip package, the ROM and DUT may be on different substrates such as depicted in FIG. 1b. The ROM 10 may be accessed via dedicated conductors 16 or via a bus 18 associated with the DUT.

Figure 2:
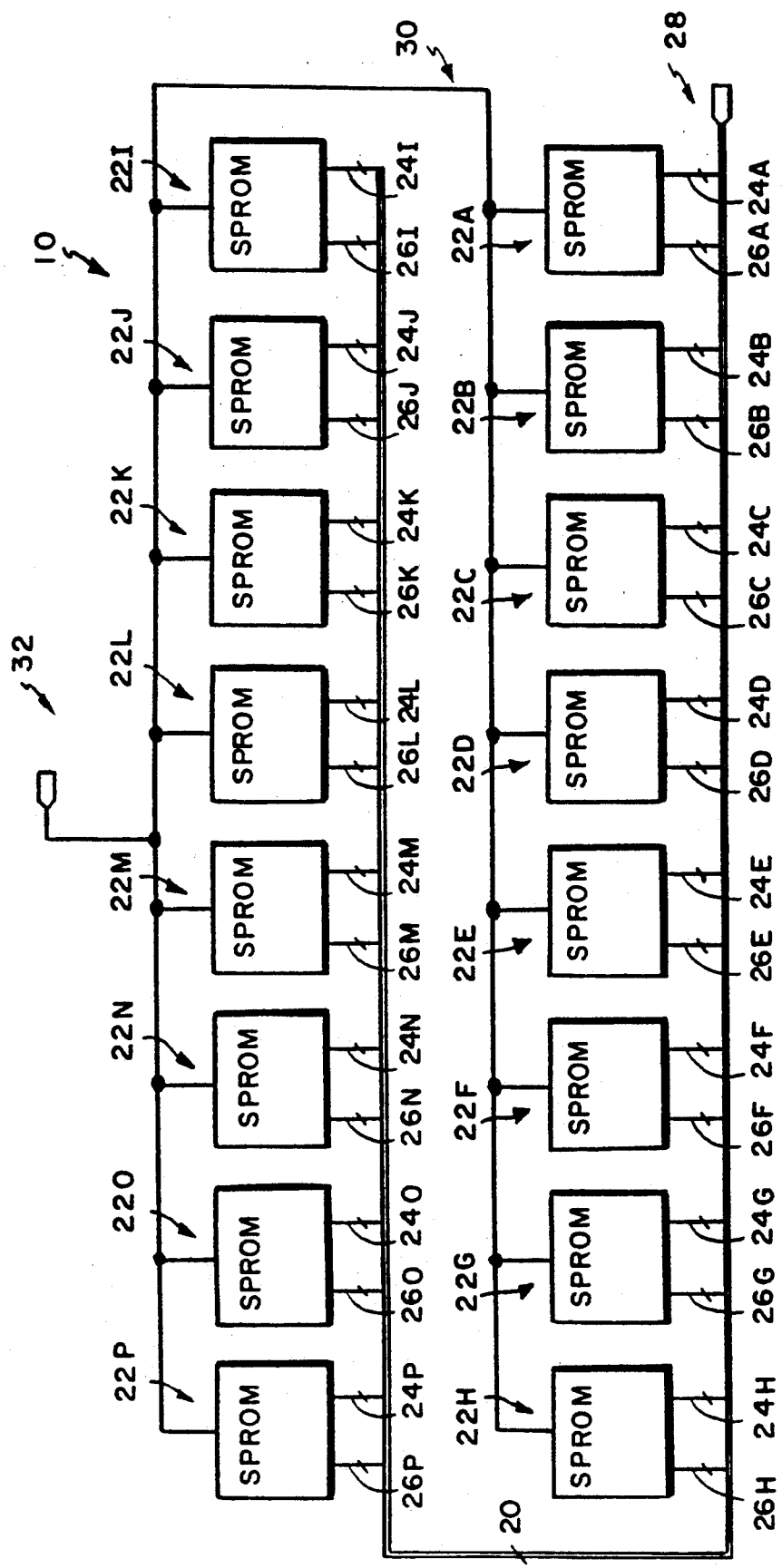
FIG. 2 is a block diagram of a first exemplary embodiment of a ROM according to the present invention, utilizing a serial interface for reading the ROM output.

FIG. 2 shows a first embodiment of the ROM 10, wherein, for purposes of convenience only, and not to limit the scope of the present invention, the ROM is depicted as utilizing a serial output interface.

A block diagram of an exemplary 16-bit ROM 10 is shown in FIG. 2. The ROM 10 contains a number of SPROM (Static Programmable Read Only Memory) cells 22(A-P). Each SPROM cell provides a 1-bit output which represents one digit of the binary word identifying the device. Therefore, in an embodiment in which the identification code is a 16-bit word, there are 16 SPROMs which constitute the ROM. Each SPROM has two inputs, labeled 24(A-P) and 26(A-P), connected to appropriate leads of, for example, bus 28. The SPROM outputs are all connected to a common parallel bus 30. A Johnson counter, not shown, can select appropriate leads in bus 28 to address the SPROMs for reading, in a manner which will be familiar to digital circuit designers. Advantageously, the Johnson counter (and other bus logic, as well as the bus) may already be present in the DUT for other purposes, so the only added hardware may be the SPROMs. Thus, if another form of bus is present, it may readily be substituted for the exemplary Johnson bus.

Figure 3:
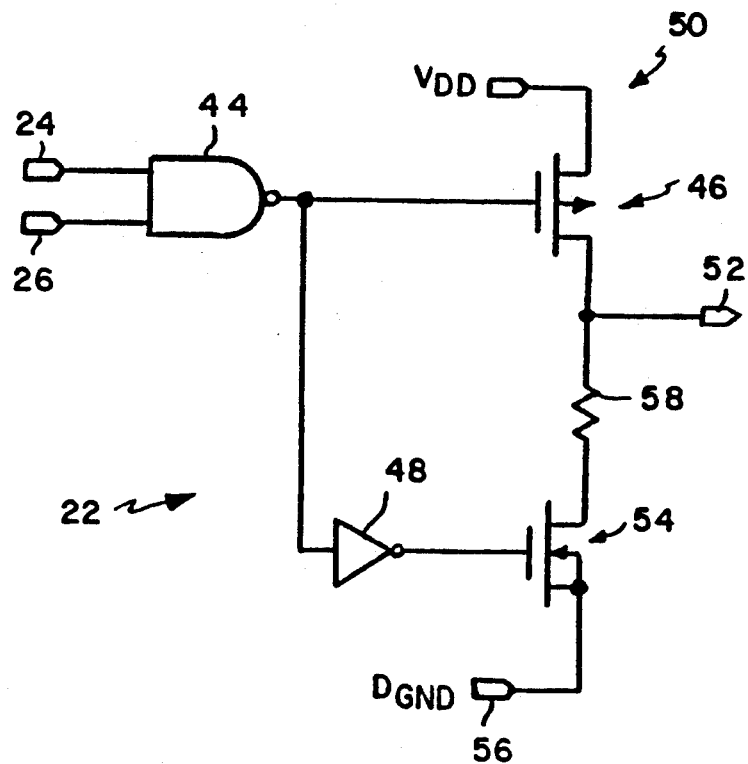
FIG. 3 is a schematic circuit diagram of one cell of the exemplary ROM of FIG. 2.

FIG. 3 illustrates an exemplary embodiment for a representative SPROM cell 22. A SPROM cell is utilized in the present invention because of its ability to be fully testable and to be programmed by laser cutting a resistive link. Those of ordinary skill in the art should realize that, of course, other memory circuits can be utilized in the present invention without departing from its spirit. Maximum benefit will be obtained from use of a non volatile ROM technology, such as the one described herein, since a device under test may lose power between successive tests. Another example of an appropriate technology is the use of fusible-link ROM, wherein the links may be electrically blown open, instead of the laser-cut thin-film resistors.

The inputs 24 and 26 of the SPROM are to be connected to appropriate leads of the Johnson bus 28 of FIG. 2. Inputs 24 and 26 are connected to a NAND gate 44. The output of the NAND gate 44 is applied to the gate of a p-channel MOSFET 46 and to the input of an inverter 48. A voltage source VDD is applied at terminal 50, to the drain of the MOSFET 46. The source of the MOSFET 46 is attached to the output connection 52 of the SPROM. The output of the inverter 48 is connected to the gate of an n-channel MOSFET 54. The source of the MOSFET 54 is connected to digital ground 56. The drain of MOSFET 54 is serially connected to one lead of a resistor link 58, the other lead of which is connected to the source of MOSFET 46 and the SPROM output 52. This circuit is a ratioed logic circuit where the n-channel FET is "strong" (i.e., drives more current than the p-channel FET) and the p-channel FET is "weak" (i.e., drives less current than the n-channel FET). Because the MOSFETs are ratioed, they will always remain in the same state (i.e., they are both either ON or both OFF).

Four operating events must now be considered initial testing of the SPROM, programming the SPROM, reading the ROM, and performing tests using the ROM Before the ROM can be considered useful, each SPROM must be tested The following procedure tests the integrity of the resistor links and the entire SPROM circuit. Before the ROM is programmed the output of the SPROMS is read. The SPROM outputs should all be "0". Thus, bus 30 should initially be at "0". If the resistor link 58 is cut or there is a malfunction in gate 44, inverter 48 or MOSFET 54, then that SPROM output will be a "1", the die is bad and it is not used. The final step in the testing of a good ROM is to program the ROM and read the data back to ensure that it is correct.

The following description illustrates the operation of a typical SPROM cell. The inputs 24 and 26 to the NAND gate 44 are both set to a "1", making the output of the NAND gate a "0". The "0" output of the NAND gate is supplied to inverter 48. This signal is inverted to a "1", which is applied to the gate of MOSFET 54, turning it on. The "0" output of the NAND gate is also applied to the gate of MOSFET 46. Because of the ratioed logic, since MOSFET 54 is on, MOSFET 46 is also turned on. Current is driven through both MOSFETs. If the resistor link 58 has not been cut, then current is driven through the resistor and due to the fact that the n-channel MOSFET 54 is strong and p-channel MOSFET 46 is weak, the former will pull down the SPROM output 52, producing a "0" output. If the resistor link 58 were cut or there was a malfunction in gate 44, inverter 48 or MOSFET 54, then the weak p-channel would pull the output high and the SPROM output would be a "1".

The SPROMs are programmed by cutting the resistor link in each SPROM which is to be set to a "1". In a preferred embodiment, the resistor link is a thin-film resistance. The links to be cut are severed by a laser beam at the time of initial wafer probing, to program each good die with die and wafer identification numbers. However, if the desired output of a SPROM is a "0" then the resistor link is not cut.

The SPROM output 52 corresponds to one digit of the binary word, which is the identification code. The SPROMs 22(A-P) in FIG. 2 are numbered so that each SPROM output corresponds to a particular digit in the binary word. For example, in FIG. 2, the output of SPROM 22A corresponds to the first digit in the binary word, the output of SPROM 22B corresponds to the second digit in the binary word, and so forth.

The present invention may utilize either a serial or parallel output interface. FIG. 2 is an embodiment of a serial interface. The Johnson bus 28 is a twenty-bit-wide bus. By tapping different connections of this bus, each cell can be enabled in sequence, forming a serial data stream at the output 32. The 16 SPROMs are enabled one at a time when both of the inputs 24 and 26 of a particular SPROM are "1". When the resistor link is not cut, the n-channel MOSFET 54 pulls down the output 52 producing a "0". When the resistor link has been cut, the p-channel MOSFET 46 pulls the output 52 high, producing a "1".

Figure 4:
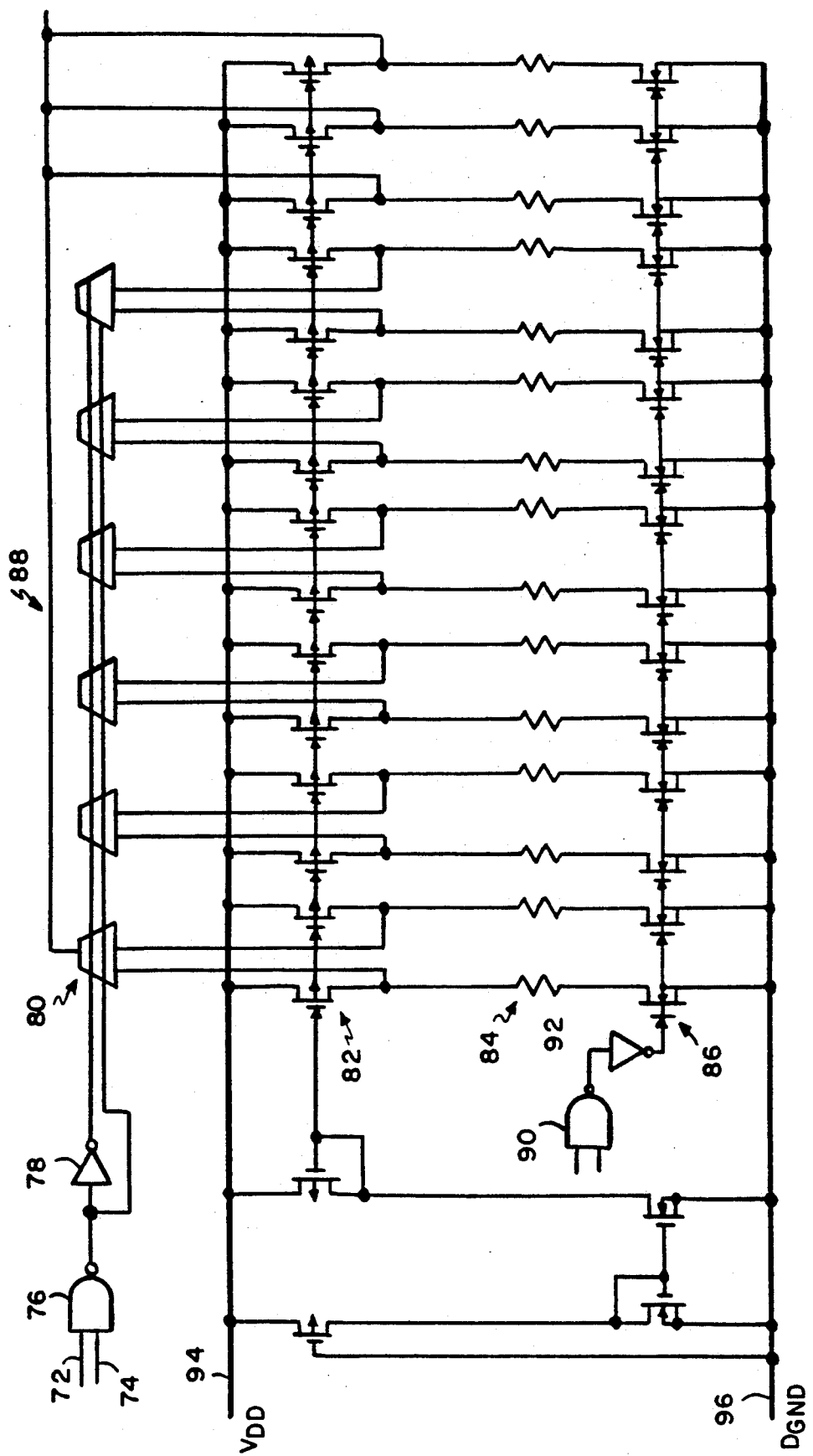
FIG. 4 is a schematic circuit diagram of a second exemplary embodiment of an identification ROM utilizing a parallel interface.

FIG. 4 is an alternative embodiment of the present invention, utilizing a parallel output interface. The ROM elements also use ratioed logic, a weak p-channel MOSFET 82 and a strong n-channel MOSFET 86. In this embodiment, a 9-bit parallel output bus 88 is used, so the ROM data is multiplexed into two read operations, one providing 9 bits and the other providing 5 bits. The status of the control signals 72 and 74 applied to the inputs of NAND gate 76 determine which word is read. There are only 15 bits used in this embodiment. Each bit value is established by the state of an associated resistor link 84 As in the serial interface embodiment, if the resistor link is cut, then the output is pulled up, but if the resistor is not cut, then the output is pulled down.

Figure 5:
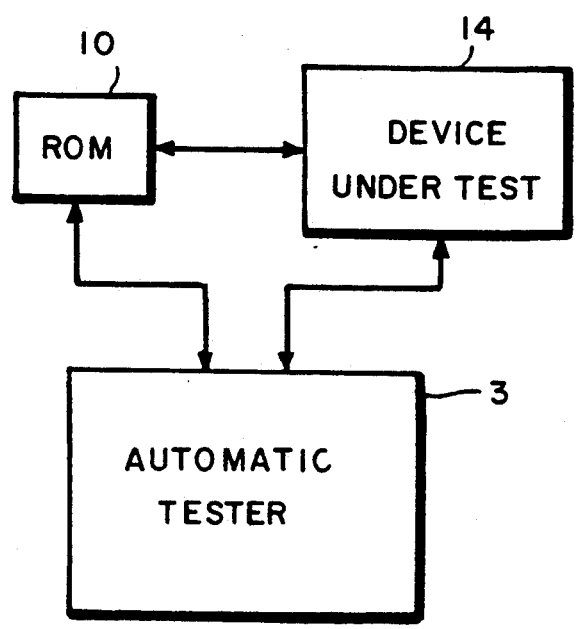
FIG. 5 is a block diagram depicting the automatic testing, the ROM and the device under test.

Having fully described the components and operation of the ROM, the method of utilizing the ROM in testing can be discussed. An automatic tester 3 (FIG. 5) is used to measure the parameters of interest. Assume the DUT is a voltage reference whose temperature coefficient is to be measured, as above. The voltage of each reference is measured at multiple temperatures and each reference's temperature coefficient is then calculated. This calculation can be performed by a calculator 7 or similar device included in tester 3. The procedure for testing the positive temperature coefficient of a voltage reference is as follows. The reference voltage is measured at 25° C., Vref(25). The reference voltage is then measured at 125° C., Vref(125). The positive temperature coefficient (TCpos) is calculated using the following formula:

$$TCpos = (Vref(125) - Vref(25))/(125 - 25)$$
[Volts/degree C]

The negative temperature coefficient (TCneg) can also be calculated by measuring the reference voltage at −55° C., Vref(−55), and then using the following formula:

$$TCneg = (Vref(25) - Vref(-55))/(125 + 55)$$
[Volts/degree C]

The negative and positive temperature coefficients may be compared to a specified predetermined acceptable temperature coefficient to determine whether or not the reference passes this test. Alternately, the data may simply be recorded to provide a test record for each DUT. DUT's can be tested or retested in random order and the temperatures may be randomly sequenced.

The ROM enables the automatic tester 3 to quickly and accurately identify the DUT being tested, at the time each measurement is made. Each time the tester 3 measures the voltage of a reference, it also reads the ROM and determines the identification code for the reference under test. It can then store all of the information and measurements on a computer disk, or in the tester 3 itself, indexing the test data with the DUT identification code. The recorded information can be a simple pass/fail result or it can be actual numeric test measurement data.

Having thus described one particular embodiment of the invention, various alterations, modifications, and improvements will readily occur to those skilled in the art. Such alterations, modifications, and improvements as are made obvious by this disclosure are intended to be part of this description though not expressly stated herein, and are intended to be within the spirit and scope of the invention. Accordingly, the foregoing description is by way of example only and is not intended as limiting. The invention is limited only as defined in the following claims and the equivalents thereto.

What is claimed is:

1. In the testing of a plurality of electronic devices to determine at least one parameter or performance characteristic of each device, wherein the data resulting from the testing is to be correlated to the electronic device producing said data, the method which comprises:

co-packaging with each said electronic device a read-only memory (ROM) thereby forming a co-packaged electronic device;

programming the ROM with an identification code of a predetermined number of bits which identifies the co-packaged electronic device uniquely from all other possible such electronic devices; said code being used to identify unambiguously said co-packaged electronic device;

reading from said co-packaged ROM the identification code programmed therein when measuring a selected characteristic of any of said electronic devices; and associating the measurement of the selected characteristic with the read identification code.

2. The method of claim 1 wherein the ROM is formed on a substrate; and the electronic device also is formed on the substrate.

3. The method of claim 1 wherein the ROM is formed on a first substrate; and the electronic device is formed on a second substrate.

4. The method of claim 1 wherein the step of programming the ROM with a device-unique identification code permanently alters the ROM.

5. The method of claim 4 wherein the ROM includes a thin-film resistor link for each bit to be programmed and the step of programming the ROM includes the operation of cutting the selected resistor link for each bit to be set to a predetermined state.

6. The method of claim 1 wherein the step of measuring a selected characteristic of the device is performed by using an automatic tester.

7. The method of claim 6 wherein the selected characteristic of the device is a temperature coefficient and the automatic tester includes means for calculating the temperature coefficient of each electronic device.

8. The method of claim 1 wherein said identification code is non-randomly generated.

9. In an integrated circuit package containing an electronic device, the improvement comprising, in addition to said device, electrically readable means, said electrically readable means is a ROM, which stores a unique device identification code and which is electrically readable for supplying one or more electrical signals for conveying said code, to identify the electronic device uniquely from all other possible such electronic devices such that said unique device identification code is associated with at least one performance characteristic of said device.

10. The apparatus of claim 9 wherein:
the electronic device is formed on a first substrate disposed in the package; and
said electrically readable means also is formed on said first substrate.

11. The apparatus of claim 9 wherein:
the electronic device is formed on a first substrate disposed in the package; and
said electrically readable means is formed on a second substrate disposed in the package.

12. The apparatus of claim 9 wherein the electrically readable means is a non-volatile ROM programmed once with a digital code.

13. The apparatus of claim 12 or 11 wherein said non-volatile ROM is connected to be read via an output bus which is connected to be employed for other purposes by the electronic device.

14. The apparatus of claim 12 where said non-volatile ROM is programmed to contain said digital code by cutting links in said non-volatile ROM.

15. The apparatus of claim 12 wherein said digital code is non-randomly generated.

16. The apparatus of claim 12 wherein said non-volatile ROM is formed on the same substrate as said electronic device.

* * * * *